United States Patent [19]

Knecht et al.

[11] Patent Number: 4,959,565
[45] Date of Patent: Sep. 25, 1990

[54] OUTPUT BUFFER WITH GROUND BOUNCE CONTROL

[75] Inventors: Mark W. Knecht, Campbell; Scott O. Frake, Santa Clara, both of Calif.

[73] Assignee: National Semiconductor Corporation, Santa Clara, Calif.

[21] Appl. No.: 309,253

[22] Filed: Feb. 10, 1989

[51] Int. Cl.[5] .................... H03K 3/13; H03K 5/13; H03K 17/28; H03K 17/687

[52] U.S. Cl. .................... 307/542; 307/443; 307/448; 307/473; 307/594; 307/596

[58] Field of Search .............. 307/251, 263, 443, 451, 307/463, 542.1, 585, 594

[56] References Cited

U.S. PATENT DOCUMENTS

| | | | |
|---|---|---|---|
| 4,725,747 | 2/1988 | Stein et al. | 307/443 |
| 4,789,793 | 12/1988 | Ehni et al. | 307/594 |
| 4,820,942 | 4/1989 | Chan | 307/443 |
| 4,885,485 | 12/1989 | Leake et al. | 307/443 |

Primary Examiner—Stanley D. Miller
Assistant Examiner—Hanh Nguyen
Attorney, Agent, or Firm—Steven F. Caserza

[57] ABSTRACT

A novel output buffer is described which includes a plurality of pull up transistors connected in parallel and/or a plurality of pull down transistors connected in parallel. A desired amount of resistance is included in the path connecting the gates of the pull up transistors, and in the path connecting the gates of the pull down transistors, thereby providing a distributed RC network causing pull up and pull down transistors to turn on in sequence. This is designed to keep the rate of change of the pull up and pull down current constant, thus reducing ground and Vcc bounce. In another embodiment, a single pull up transistor and/or a single pull down transistor is used. The single transistors have a relatively high gate resistance such that along the channel width of the transistor, the gate capacitance and the gate resistance operates as a distributed RC network. In this manner, portions of the channel begin conducting sequentially, as is the case where a plurality of pull up and pull down transistors are used.

28 Claims, 7 Drawing Sheets $V_{GROUND} = L(di/dt)$

GROUND BOUNCE

```
(ABCD)---------- -2.000D+00      0.000D+00      2.000D+00      4.000D+00  6.000D+00
                           -------------------------------------------------------
0.000D+00  4.947D+00  .              .X              .              .       X       .
2.500D-10  4.947D+00  .              .X              .              .       X       .
5.000D-10  4.947D+00  .              .X              .              .       X       .
7.500D-10  4.947D+00  .              .X              .              .       X       .
1.000D-09  4.947D+00  .              .X              .              .       X       .
1.250D-09  4.947D+00  .              .X              .              .       X       .
1.500D-09  4.947D+00  .              .X              .              .       X       .
1.750D-09  4.946D+00  .              .X              .              .       X       .
2.000D-09  4.941D+00  .              .X              .              .       X       .
2.250D-09  4.952D+00  .              .X              .              .       X       .
2.500D-09  4.992D+00  .              .X              .              .       X       .
2.750D-09  4.937D+00  .              . DC            .              .       X       .
3.000D-09  4.808D+00  .              . D  C          .              .      AB       .
3.250D-09  4.640D+00  .              .   D  C        .              .    A  B       .
3.500D-09  4.428D+00  .              .     D  C .                   .   A B         .
3.750D-09  4.211D+00  .              .      D   C.                  .A B            .
4.000D-09  3.970D+00  .              .        D   C.                A B             .
4.250D-09  3.708D+00  .              .         D  C .             A B               .
4.500D-09  3.445D+00  .              .          D  C .          A B .               .
4.750D-09  3.166D+00  .              .           D C .        A B   .               .
5.000D-09  2.882D+00  .              .            DC      A  B     .                .
5.250D-09  2.604D+00  .              .            X      . AB                        .
5.500D-09  2.322D+00  .              .           CD      . AB                        .
5.750D-09  2.043D+00  .              .        C   D     AB                          .
6.000D-09  1.778D+00  .              .      C    D     AB.                          .
6.250D-09  1.520D+00  .              .   C    D    BA  .                            .
6.500D-09  1.279D+00  .              .C      D  BA     .                            .
6.750D-09  1.049D+00  .              .C     D X        .                            .
7.000D-09  8.088D-01  .              .C    XA          .                            .
7.250D-09  5.506D-01  .              .C   X            .                            .
7.500D-09  2.923D-01  .              .CX               .                            .
7.750D-09  4.932D-02  .              AX                .                            .
8.000D-09 -1.706D-01  .             ADX                .                            .
8.250D-09 -3.603D-01  .           A DX                 .                            .
8.500D-09 -5.185D-01  .           A CX.                .                            .
8.750D-09 -6.416D-01  .           ACDB.                .                            .
9.000D-09 -7.218D-01  .           ACDB .               .                            .
9.250D-09 -7.515D-01  .           X X  .               .                            .
9.500D-09 -7.416D-01  .           X X  .               .                            .
9.750D-09 -7.028D-01  .           XDB  .               .                            .
1.000D-08 -6.478D-01  .           XX   .               .                            .
                           -------------------------------------------------------
```

FIG. 8

OUTPUT BUFFER WITH GROUND BOUNCE CONTROL

FIELD OF THE INVENTION

This invention pertains to integrated circuits and more particularly to output structures including a means for controlling ground bounce.

BACKGROUND

FIG. 1 is a schematic diagram of a portion of a typical prior art integrated circuit output stage. Output stage 10 includes a plurality of output buffers, such as output buffers 11-1 and 11-2. As is well known in the art, typical output buffers include a P channel pull up transistor 12-1 having its source connected to Vcc, its drain connected to output lead 14-1, and its gate connected to control gate lead 11-1. A pull down transistor 13-1 has its gate connected to control gate lead 11-1, its drain connected to output lead 14-1, and its source connected to ground line 19. Each of the output buffers is connected in parallel between Vcc and ground line 19, and receives individual control signals on their gate control leads 11-1, 11-2, etc. in order to provide corresponding output signals on output leads 14-1, 14-2, etc., respectively.

The integrated circuit is contained within an integrated circuit package, such as a ceramic dual in line package (DIP) or a plastic DIP, for example. The leads of such packages include inductance such that ground line 19 on the integrated circuit is connected to external ground 18 through inductance 16. Unfortunately, this inductance causes ground bounce, i.e. a shift in the actual voltage on ground lead 19 due to changes in current flowing through inductor 16 to external ground 18.

The primary cause of such changes in current flowing through inductor 16 is switching of output buffers. Thus, for example, with the control signal applied to lead 11-2 held high in order to turn off pull up transistor 12-2 and turn on pull down transistor 13-2, output lead 14-2 is connected to ground lead 19. Ideally, the voltage on output lead 14-2 would be exactly equal to the externally supplied ground voltage on terminal 18, without any noise. Unfortunately, as other output buffers in the integrated circuit switch, current flowing to ground 18 through inductor 16 changes, thus changing the voltage on ground lead 19. This is depicted in FIG. 2.

With the voltage on control gate lead 11-2 held high, the output voltage on output lead 14-2 is low. With the voltage applied to control gate 11-1 low, the output voltage on output lead 14-1 is high, and no change in current is taking place through inductor 18, and thus ground lead 19 is at the same voltage level as external ground 18. When the voltage applied to control gate 11-1 rises, pull up transistor 12-1 turns off and pull down transistor 13-1 turns on. At this time, the output voltage on output terminal 14-1 falls since the charge stored in load capacitance 15-1 is discharged to ground 18 through conducting pull down transistor 13-1 and inductor 16. Thus, with a change in current I flowing through inductor 16, the voltage on ground lead 19 rises for a time and then falls as the current being discharged from load capacitance 15-1 decreases. The voltage on ground lead 19 with respect to external ground 18 is determined by the following equation $$Vgnd = L_{16} \frac{di}{dt} ; \text{where} \tag{1}$$

Vgnd = the voltage on ground level 19 with respect to external ground 18;

$L_{16}$ = the inductance of inductor 16; and $\frac{di}{dt}$ = the rate of change of current I through inductor 16.

This bounce in the voltage on ground lead 19 causes a similar bounce on the output voltage on output lead 14-2 which ideally should be held precisely at the voltage level of external ground 18. Furthermore, the portion of the ground bounce of ground lead 19 which extends below zero volts causes a similar excursion of output voltage 14-2 below zero volts.

The lead connecting the integrated circuit Vcc lead to an externally supplied Vcc also has inductance. This causes a Vcc bounce, i.e. a change in voltage on the Vcc lead of the integrated circuit within the package, in response to changes in current flowing through the inductance associated with the Vcc lead. As with changes in ground current, changes in Vcc current are primarily due to switching of the output buffers.

The effect of ground bounce is exacerbated when a number of output buffers switch simultaneously, as is often the case. Furthermore, as the speed of the device increases, output buffer switching speeds increase, thus causing increases in the time rate of change of currents as compared with slower devices.

Ground and Vcc bounce is undesirable for a number of reasons. First, it affects the voltage on output leads, possibly to the extent that a temporary change in logical levels is realized. Secondly, ground and Vcc bounce affects the ground and Vcc voltages applied to other portions of the integrated circuit, affecting their operation including possibly making operation fail altogether. Furthermore, circuit designers must consider the fact that ground and Vcc bounce is present in their circuits and design their circuits more carefully in order to avoid operating failures due to ground and Vcc bounce.

It has been recognized that by providing a constant rate of change in ground and Vcc currents, ground and Vcc bounce can be minimized. This is described, for example, in *IEEE Journal of Solid-State Circuits*, Vol. SC-22, No. 5, October 1987, pages 744–746, and is depicted in FIGS. 3a and 3b. FIG. 3a shows a typical di/dt curve 30 depicting the change in ground voltage when an output switches. FIG. 3b shows the change in ground current accompanying the change in ground voltage shown in FIG. 3a. Without any control of the output switching, there is a relatively rapid change in current initially, which then tapers off. This nonlinearity in current increases ground and Vcc bounce. Ideally, di/dt can be made constant as shown in curve 31, thereby reducing the maximum ground bounce.

One technique for reducing ground bounce to a certain extent is shown in the schematic diagram of FIG. 4. FIG. 4 shows an output buffer including a pull up transistor 42, and two pull down transistors 43-a and 43-b. Pull down transistor 43-a is controlled by the signal applied to terminal 41 and pull down transistor 43-b is controlled by the signal applied to terminal 41 as delayed by delay means 45. Delay means 45 can be any convenient delay circuit, such as two inverters connected in cascade. The operation of the circuit of FIG. 4 has the effect of causing a certain amount of current to be discharged to ground through transistor 43-a during initial stages of switching and, at a specified time thereafter, drawing additional current through pull down transistor 43-b at a time later along curve 30 of FIG. 3, thereby tending to reduce the nonlinearity in current shown in curve 30. However, this technique requires additional components in the form of delay means 45.

SUMMARY OF THE INVENTION

In accordance with the teachings of this invention, a novel output buffer is described which includes a plurality of pull up transistors connected in parallel and/or a plurality of pull down transistors connected in parallel. A desired amount of resistance is included in the path connecting the gates of the pull up transistors, and in the path connecting the gates of the pull down transistors, thereby providing a distributed RC network causing pull up and pull down transistors to turn on in sequence. This tends to keep the rate of change of the pull up and pull down current constant, thus reducing ground and Vcc bounce.

In another embodiment of this invention, a single pull up transistor and/or a single pull down transistor is used. The single transistors have a relatively high gate resistance such that along the channel width of the transistor, the gate capacitance and the gate resistance operates as a distributed RC network. In this manner, portions of the channel begin conducting sequentially, as is the case where a plurality of pull up and pull down transistors are used.

BRIEF DESCRIPTION OF THE DRAWINGS

FIG. 3b is a graph depicting currents associated with di/dt curves of FIG. 3a;

FIGS. 7a through 7d depict one example of how the embodiments of FIG. 6a through FIG. 6d may be simulated; and FIG. 8 is a set of curves showing the improvement of ground bounce realized utilizing a circuit constructed in accordance with the teachings of one embodiment of this invention.

DETAILED DESCRIPTION

Figure 1:
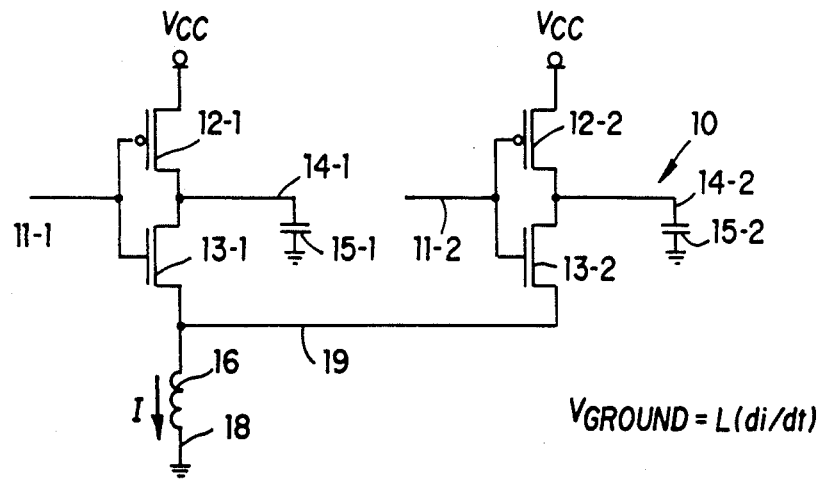
FIG. 1 is a schematic diagram of a portion of a prior art integrated circuit showing two output buffers.
Figure 2:
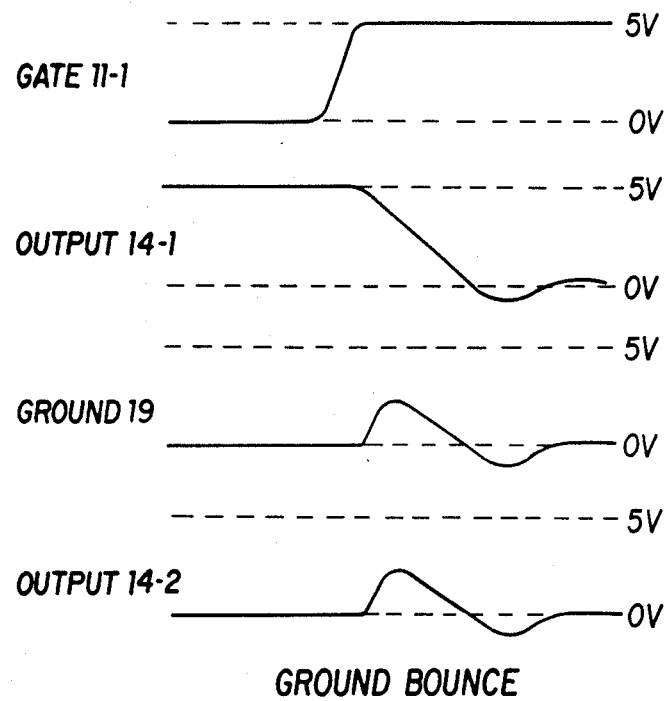
FIG. 2 is a set of waveforms depicting voltage levels in the circuit of FIG. 1 during switching.
Figure 3A:
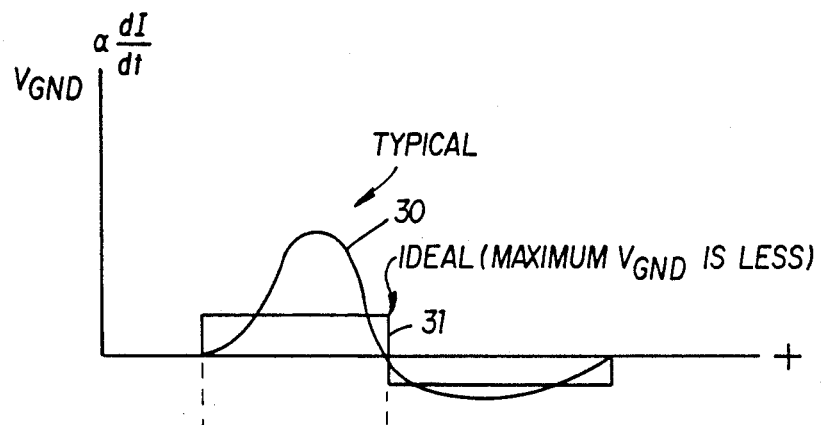
FIG. 3a is a graph depicting a typical nonconstant di/dt curve and an improved di/dt curve.
Figure 3B:
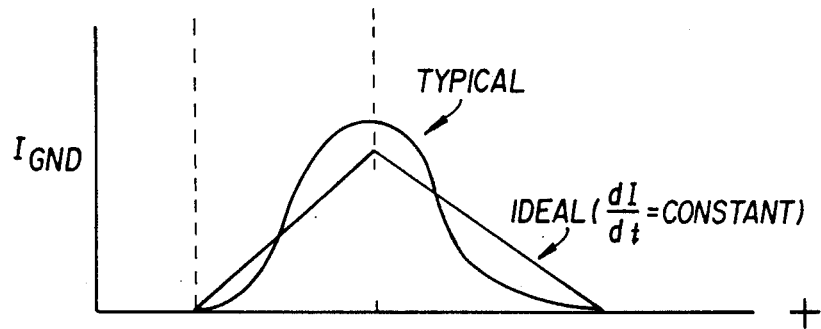
Figure 5:
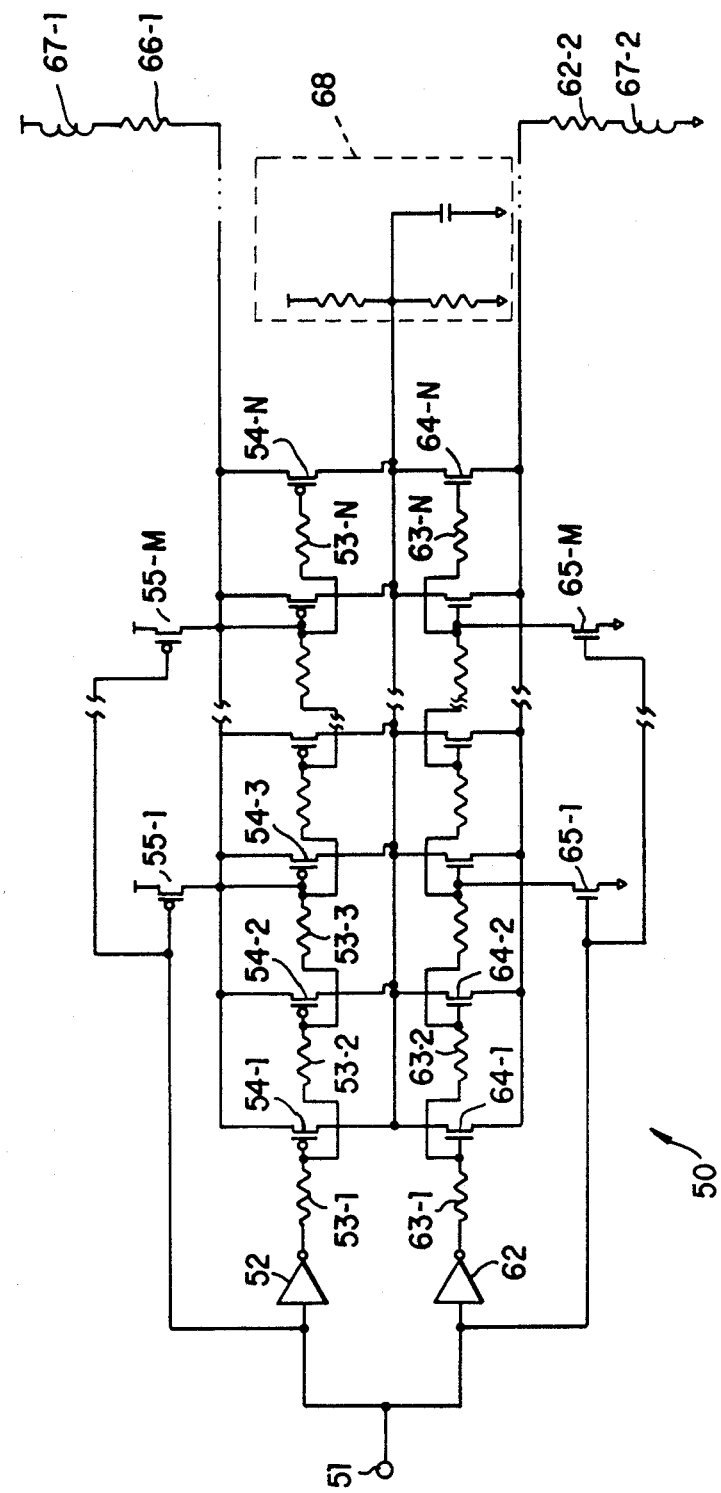
FIG. 5 is a schematic diagram of one embodiment of an output buffer constructed in accordance with the teachings of this invention.

FIG. 5 is a schematic diagram of one embodiment of an output buffer constructed in accordance with the teachings of this invention. Output buffer 50 includes control terminal 51 which receives a signal indicating when pull up transistors 54-1 through 54-N and pull down transistor 64-1 through 64-N are to be turned off, and vice versa. Resistors 53-1 through 53-N are connected in series between inverter 52 and the gate of each pull up transistor 54-1 through 54-N, respectively. These series resistors, together with the gate capacitances of pull up transistors 54-1 through 54-N, serve to provide a distributed RC network. This distributed RC network serves to provide a delay time between the time pull up transistor 54-1 turns on and successive ones of transistors 54-2 through 54-N turn on. This controls the pull up switching current, tending to keep di/dt constant and shifting the di/dt waveform from that shown as curve 30 of FIG. 3a to that shown as curve 31 of FIG. 3a.

In a similar manner, pull down transistors 64-1 through 64-N are successively turned on due to the distributed RC network provided by resistors 63-1 through 63-N and the gate capacitances of transistors 64-1 through 64-N. This controls the pull down current, tending to keep di/dt constant and shifting the di/dt waveform from that shown in curve 30 of FIG. 3a to that shown as curve 31 of FIG. 3a.

The fabrication of the pull up transistors 54-1 through 54-N, pull down transistors 64-1 through 64-N, and resistances 53-1 through 53-N and 63-1 through 63-N is relatively straight forward. It is known in the art to use a plurality of pull up transistors connected in parallel and a plurality of pull down transistors connected in parallel in order to provide the desired amount of pull up and pull down current carrying capability, respectively. However, it has heretofor been desired to reduce the resistance connecting the gates of these devices in order to provide maximum switching speed for the device. In contrary to this teaching of the prior art, in accordance with the teachings of this invention resistances 53-1 through 53-N and 63-1 through 63-N are specifically made not as low as possible, thereby providing a desired RC time delay in turning on successive pull up and pull down transistors. In one embodiment of this invention, resistors 53-1 through 53-N and 63-1 through 63-N are provided by the resistance of the polycrystalline silicon gates of transistors 54-1 through 54-N and 64-1 through 64-N, and these polycrystalline silicon paths are not strapped with metal to reduce their resistance as is done in the prior art.

In another embodiment of this invention, resistors 53-1 through 53-N and 63-1 through 63-N are formed of polycrystalline silicon, but are not doped to the extent other portions of the polycrystalline silicon layer is doped on other portions of the integrated circuit, thereby causing resistors 53-1 through 53-N and 63-1 through 63-N to have higher resistance values than other portions of the polycrystalline silicon interconnect layer. In yet another embodiment of this invention, additional resistors are placed between adjacent gates, for example by additional lengths of polycrystalline silicon interconnects, polycrystalline silicon resistors, defused resistors, or the like, in order to achieve the desired inter-gate resistance value.

For example, in one embodiment, resistors 53-1 through 53-N and 63-1 through 63-N are formed of polycrystalline silicon which is doped to have a sheet resistance within the range of approximately 10 to 40 ohms/square. These resistors are, if desired, formed as the gate electrodes of these pull up and pull down transistors. In one embodiment of this invention, the integrated circuit including output stage 50 also includes additional portions of polycrystalline silicon serving as gate electrodes and electrical interconnects. In one such embodiment, these other portions of polycrystalline silicon have resistivity lower than that of resistors 53-1 through 53-N and 63-1 through 63-N, for example within the range of approximately 2 to 10 ohms/square. In one embodiment, these other portions of polycrystalline silicon are strapped with metal in order to provide a reduced overall resistance. In yet another embodiment, these other portions of polycrystalline silicon combined with refractory metal in order to provide a silicide, or the like, having a low resistivity.

In one embodiment of this invention, the resistor values are equal providing a desired RC distributed network. In another embodiment of this invention, the resistor values are not equal, for example providing either greater or lesser resistance the further one gets down a chain of resistors, such as the chain of resistors comprising resistors 53-1 through 53-N. In one embodiment of this invention, transistors in the chain, such as the chain of pull up transistors 54-1 through 54-N, have the same characteristics, i.e. the same channel widths and lengths. In another embodiment of this invention, the transistors along the chain have different characteristics, for example having widths and thus current carrying capabilities which increase or decrease down the chain.

In accordance with one embodiment of this invention, the structure is scalable. As the length of a transistor channel decreases, its current carrying capability increases and the width of the polycrystalline silicon gate decreases, thereby increasing gate resistance. This allows for great ease in reducing integrated circuit size, because as integrated circuits become smaller, channel lengths become shorter, thereby increasing current carrying capability for a given transistor width.

In one embodiment of this invention, such a chain providing control over di/dt is used only for the pull down transistors, when one is only concerned with ground bounce. In another embodiment of this invention, such a chain is used only in conjunction with the pull up transistors, when one is only concerned with Vcc bounce. In yet another embodiment of this invention, such chains are used in association with both the pull up transistors and the pull down transistors, thereby providing desired ground bounce and Vcc bounce characteristics.

In one embodiment of this invention, resistors 53-1 and 63-1 are not used in order to not delay the turn on of transistors 54-1 and 64-1, respectively. This embodiment serves to allow switching to begin without any additional delay, although the di/dt characteristics of the device are tailored by the use of resistors 53-2 through 53-N and 63-2 through 63-N. In one embodiment of this invention, the omission of resistors 53-1 and 63-1 is accomplished by strapping that portion of the polycrystalline silicon with metal so as to decrease its resistance. In another embodiment of this invention, the connection between inverters 52 and 62 and transistors 54-1 and 64-1, respectively, are made with highly doped polycrystalline silicon having relatively low resistance, while resistors 53-2 through 53-N and 63-2 through 63-N are formed of polycrystalline silicon which is not doped or doped more lightly in order to have a higher resistance.

While it is desired to turn on pull up transistors and pull down transistors in sequence along the pull up and pull down chains, respectively, it is important that no pull up transistor and pull down transistor be turned on simultaneously, as that would provide an undesired current path straight from Vcc to ground causing excessive power consumption and other deleterious effects with regard to noise on the Vcc line and ground line. In one embodiment of this invention, as shown in FIG. 5, additional transistors 55-1 through 55-M are connected to various gate electrodes in the pull up transistor chain in order to more rapidly turn off the pull up transistors than would otherwise be possible due to the increased resistance provided by resistors 53-1 through 53-N. Similarly, as shown in FIG. 5, transistors 65-1 through 65-M are, in one embodiment, provided to increase the speed of turning off pull down transistors 64-1 through 64-N than would otherwise be possible due to the increased gate resistance of resistors 63-1 through 63-N.

If desired, a single pull up transistor and a single pull down transistor can be used in accordance with the teachings of this invention. In this case, the channel widths of the pull up and pull down transistors will be relatively large in order to provide sufficient current carrying capability. A wide channel necessarily means a relatively long gate electrode overlying the channel. Thus, in this embodiment, a relatively high gate electrode resistance is used such that the gate capacitance and gate resistance provides distributed RC network along the transistor channel, causing portions of the transistor channel to turn on sequentially.

Constructing an output buffer in accordance with the teachings of this invention requires the selection of gate resistance values, gate capacitance values, and pull up and pull down transistor current carrying capabilities in order to provide a desired di/dt curve which is flatter than in the prior art. Different circumstances will necessitate different di/dt curves depending on how concerned one is with Vcc bounce, ground bounce, and switching speed. However, each of these factors is taken into account while further considering the value of package inductance.

It is also desirable to provide a device which is easily configurable for use in a number of package types each having different lead inductance characteristics, while providing that each packaged device, regardless of the package type used, has a similar ground bounce and Vcc bounce characteristic. In accordance with one embodiment of this invention, an integrated circuit is constructed to have several possible configurations of the gate resistances, which are then selected during or after fabrication depending on the inductance of the specific package type into which the integrated circuit is to be placed.

Figure 6A:
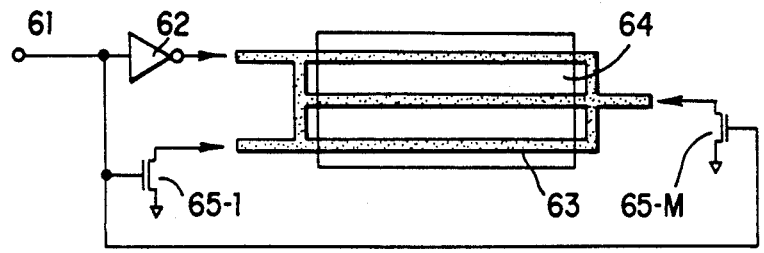
FIGS. 6a through 6d depict how an output buffer may be fabricated in accordance with one embodiment of this invention to allow different options for use in conjunction with different packages having different lead inductances.
Figure 6B:
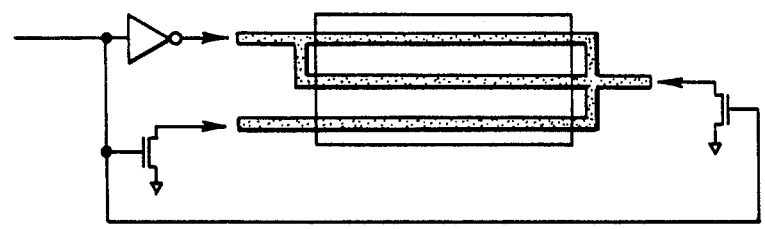
Figure 6C:
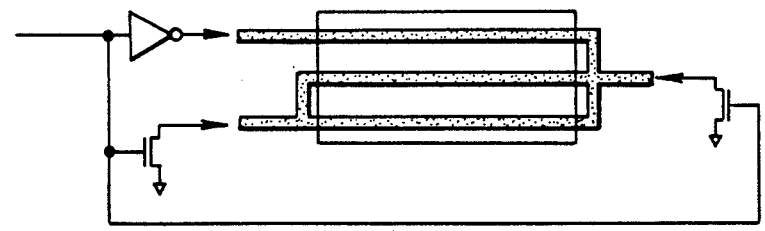
Figure 6D:
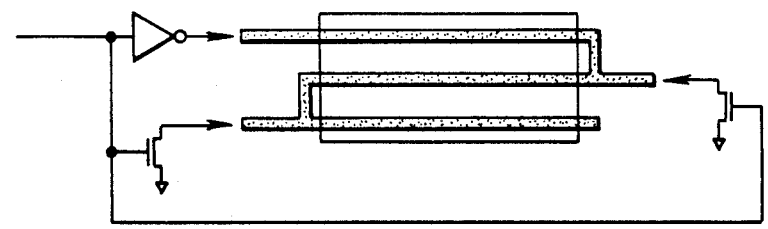
Figures 7A, 7B, 7C, 7D:
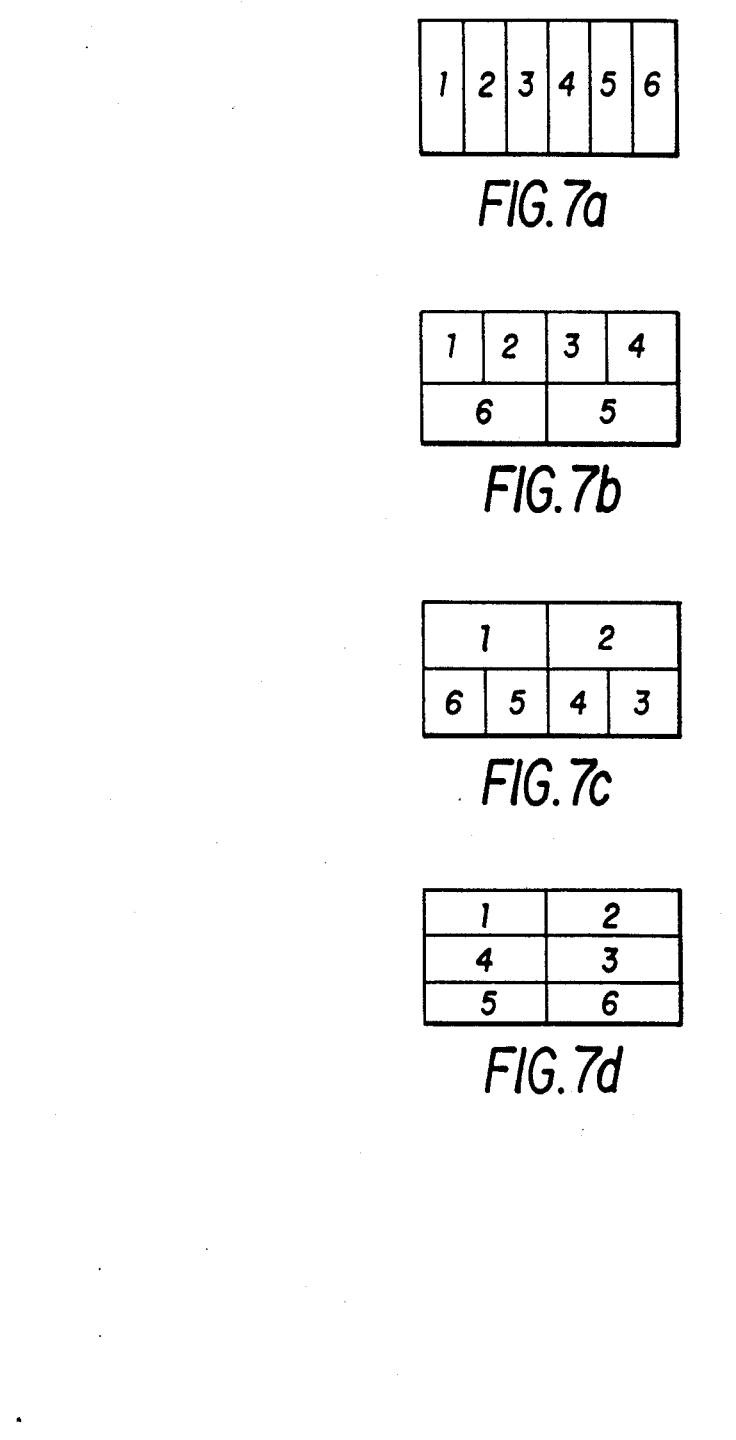

As shown in FIG. 6a, for example, pull down transistor 64-1 is shown including polycrystalline silicon gate 63, with the pattern of the polycrystalline silicon made in a fashion such that transistor 64 may be simulated by a series of six transistors, for example, as shown in FIG. 7a. FIG. 7a shows the six transistors which are utilized to simulate transistor 64 of FIG. 6a, and which are numbered to show their turn on sequence as a result of the distributed RC network provided by the resistance of gate electrode 63 and the gate to channel capacitance. In the embodiment of FIG. 7a, each transistor of the simulation has the same gate resistance and gate capacitance. FIG. 6b shows an alternative arrangement of the same circuit layout as in FIG. 6a with the exception that the layer of polycrystalline silicon is patterned slightly different such that transistor 64 may be simulated by six transistors having their size and turn on sequence shown in FIG. 7b, wherein each of these six transistors have equal gate to channel capacitance, but transistors 1 through 4 have one-fourth the gate resistance of transistors 5 and 6 FIGS. 6c and 6d show alternative patterns of polycrystalline silicon-gate electrode 63 which provide the equivalent of six transistors shown in FIG. 7c, and 7d, respectively.

While for the purposes of example, FIG. 7a through 7d show six transistors, this is shown only by way of example and for purposes of modeling. In reality, transistor 64 is single transistor whose distributed RC network causes portions of its single channel to turn on in an uninterrupted sequence over its channel width. Furthermore, the configuration shown in FIGS. 7a through 7d provide for different combinations of gate capacitance and gate resistance among the four layouts shown. In this manner, during fabrication the device is fabricated identically and a separate mask used to pattern the polycrystalline silicon layer in any one of a desired number of ways in order to provide a device having gate capacitance and gate resistance tailored as a function of channel width to adjust the ground and Vcc bounce for a particular package inductance associated with a particular package which that device will be placed.

Figure 4:
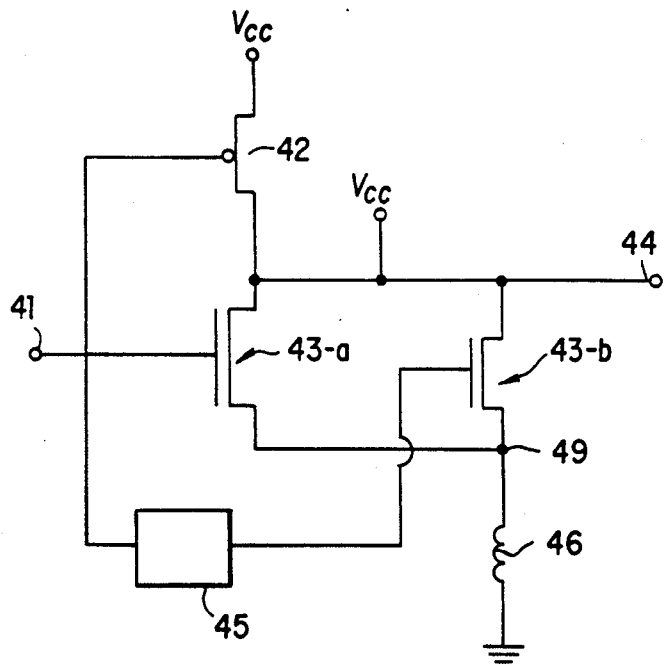
FIG. 4 is a schematic diagram of a prior art attempt to minimize ground bounce.

FIG. 8 is a set of curves depicting an output switching curve (curve A) of an output circuit of FIG. 4, the output switching curve (curve B) of a circuit constructed in accordance with the teachings of this invention utilizing pull up and pull down transistors which are identical (except for gate resistance) to those used in the example of FIG. 4. FIG. 8 also shows the ground bounce for the prior art circuit (curve C) associated with curve A and the ground bounce (Curve D) associated with curve B. As shown in FIG. 8, the output switching characteristics are substantially identical, and yet the ground bounce curve is smoothed out and provides a lower peak ground bounce when utilizing a circuit in accordance with the teachings of this invention.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An output circuit comprising:
    a first supply terminal for receiving a first supply voltage;
    an input terminal for receiving an input signal;
    an output terminal for providing an output signal as a result of said input signal;
    a first plurality of transistors, each having a first current carrying lead coupled to said first supply terminal, a second current carrying lead coupled to said output terminal, and a control lead having a capacitance associated therewith; and
    a plurality of polycrystalline silicon resistors coupled in series between said control leads of adjacent ones of said plurality of transistors, one of said plurality of resistors also being coupled to said input terminal said polycrystalline silicon having a sheet resistance within the range of approximately 10 to 40 ohms/square,
    wherein said plurality of resistors and said capacitances form a distributed RC network which causes said first plurality of transistors to turn on in sequence in response to said control signal.

2. An output circuit as in claim 1 wherein said resistors comprise resistances associated with said control leads of said plurality of transistors.

3. An output circuit as in claim 1 wherein said resistors comprise resistances coupled between control leads of adjacent ones of said plurality of transistors.

4. An output circuit as in claim 2 wherein said resistors further comprise additional resistances coupled between control leads of adjacent ones of said plurality of transistors.

5. An output circuit as in claim 2 wherein each of said transistors comprise MOS transistors having a first source/drain lead serving as said first lead of said transistor, a second source/drain lead serving as said second lead of said transistor, and a polycrystalline silicon gate serving as said control lead of said transistor,
    wherein said capacitance comprises the gate capacitance of said transistor and said resistance comprises the resistance of said gate.

6. An output circuit as in claim 5 wherein said polycrystalline silicon is not strapped with metal to reduce its resistance.

7. An output circuit as in claim 6 in combination with other circuitry, said combination further comprising additional portions of polycrystalline silicon not serving as said gate electrodes of said output circuit, said additional portions having a sheet resistance within the range of approximately 2 to 10 ohms/square.

8. An output circuit as in claim 7 wherein said additional portions of polycrystalline silicon are strapped with metal to provide a low resistivity interconnect.

9. An output circuit as in claim 7 wherein said additional portions of polycrystalline silicon further comprise a refractory metal in order to reduce the resistivity of said additional portions.

10. An output circuit as in claim 1 wherein the resistances of said resistors are of approximately equal values.

11. An output circuit as in claim 1 wherein the resistance of each of said resistors is greater as its distance from said input terminal increases.

12. An output circuit as in claim 1 wherein the resistance of each of said resistors is less as its distance from said input terminal increases.

13. An output circuit as in claim 1 wherein the current carrying capability of each of said transistors is approximately equal.

14. An output circuit as in claim 1 wherein the current carrying capability of each of said transistors is greater as its distance from said input terminal increases.

15. An output circuit as in claim 1 wherein the current carrying capability of each of said transistors is less as its distance from said input terminal increases.

16. An output circuit as in claim 1 which further comprises one or more turn off switch means, each comprising:
    a first current carrying terminal coupled to said first supply voltage;
    a second current carrying terminal coupled to the control lead of a selected one of said switch means; and
    a control terminal coupled to said input terminal.

17. An output circuit as in claim 1 which further comprises:
- a second supply terminal for receiving a second supply voltage;
- a second plurality of transistors, each having a first current carrying lead coupled to said second supply terminal, a second current carrying lead coupled to said output terminal, and a control lead having a capacitance associated therewith; and
- a plurality of resistors coupled in series between said control leads of adjacent ones of said second plurality of transistors, one of said second plurality of resistors also being coupled to said input terminal,
- wherein said second plurality of resistors and said capacitances form a distributed RC network which causes said second plurality of transistors to turn on in sequence in response to said control signal.

18. An output circuit comprising:
- a first supply terminal for receiving a first supply voltage;
- an input terminal for receiving an input signal;
- an output terminal for providing an output signal as a result of said input signal; and
- a first MOS transistor having a first source/drain lead coupled to said first supply terminal, a second source/drain lead coupled to said output terminal, a channel located between said first and second source/drain regions, and a control gate comprising polycrystalline silicon having a sheet resistance within the range of approximately 10 to 40 ohms/square coupled to said input terminal and having a capacitance and a resistance associated therewith;
- wherein said resistance and said capacitance forms a distributed RC network which causes portions of said channel of said first MOS transistor to turn on in sequence in response to said control signal.

19. An output circuit as in claim 18 wherein said polycrystalline silicon is not strapped with metal to reduce its resistance.

20. An output circuit as in claim 18 in combination with other circuitry, said combination further comprising additional portions of polycrystalline silicon not serving as said gate of said first MOS transistor, said additional portions having a sheet resistance with the range of approximately 2 to 10 ohms/square.

21. An output circuit as in claim 20 wherein said additional portions of polycrystalline silicon are strapped with metal to provide a low resistivity interconnect.

22. An output circuit as in claim 20 wherein said additional portions of polycrystalline silicon further comprise a refractory metal in order to reduce the resistivity of said additional portions.

23. An output circuit as in claim 18 wherein the resistance of said gate per unit width of said channel is approximately equal over the length of said gate.

24. An output circuit as in claim 18 wherein the resistance of said gate per unit width of said channel is greater as its distance from said input terminal increases.

25. An output circuit as in claim 18 wherein the resistance of said gate per unit width of said channel is less as its distance from said input terminal increases.

26. An output circuit as in claim 18 which further comprises one or more turn off switch means, each comprising:
- a first current carrying terminal coupled to said first supply voltage;
- a second current carrying terminal coupled to a selected location of said gate; and
- a control terminal coupled to said input terminal.

27. An output circuit as in claim 18 which further comprises:
- a second supply terminal for receiving a second supply voltage; and
- a second MOS transistor having a first source/drain lead coupled to said second supply terminal, a second source/drain lead coupled to said output terminal, a channel located between said first and second source/drain regions, and a control gate coupled to said input terminal and having a capacitance and resistance associated therewith;
- wherein said resistance and said capacitance forms a distributed RC network which causes portions of said channel of said second MOS transistor to turn on in sequence in response to said control signal.

28. An output circuit comprising:
- a first supply terminal for receiving a first supply voltage;
- an input terminal for receiving an input signal;
- an output terminal for providing an output signal as a result of said input signal;
- a first plurality of transistors, each having a first current carrying lead coupled to said first supply terminal, a second current carrying lead coupled to said output terminal, and a control lead having a capacitance associated therewith; and
- a plurality of resistors coupled in series between said control leads of adjacent ones of said plurality of transistors, one of said plurality of resistors also being coupled to said input terminal, said resistors selected from the group of resistors consisting of diffused resistors and load devices,
- wherein said plurality of resistors and said capacitances form a distributed RC network which causes said first plurality of transistors to turn on in sequence in response to said control signal.

* * * * *